(12) United States Patent
Miya et al.

(10) Patent No.: US 8,109,282 B2
(45) Date of Patent: Feb. 7, 2012

(54) SUBSTRATE PROCESSING APPARATUS AND SUBSTRATE PROCESSING METHOD

(75) Inventors: Katsuhiko Miya, Kyoto (JP); Akira Izumi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 958 days.

(21) Appl. No.: 11/860,173

(22) Filed: Sep. 24, 2007

(65) Prior Publication Data

US 2008/0078426 A1  Apr. 3, 2008

(30) Foreign Application Priority Data

Sep. 28, 2006  (JP) .................................. 2006-265137

(51) Int. Cl.
B08B 3/10 (2006.01)

(52) U.S. Cl. ...................... 134/95.1; 134/94.1; 134/95.2; 134/99.1; 134/102.1; 134/902

(58) Field of Classification Search .................... 134/30, 134/95.1, 95.2, 95.3, 99.1, 102.1, 102.2, 134/102.3, 94.1

See application file for complete search history.

(56) References Cited

U.S. PATENT DOCUMENTS

| | | | |
|---|---|---|---|
| 5,882,433 A | 3/1999 | Ueno | |
| 6,193,798 B1 | 2/2001 | Sumnitsch | |
| 6,273,104 B1 * | 8/2001 | Shinbara et al. | 134/25.4 |
| 2002/0179120 A1 * | 12/2002 | Ono et al. | 134/26 |
| 2003/0047192 A1 * | 3/2003 | Ono et al. | 134/1.3 |
| 2003/0102017 A1 | 6/2003 | Taniyama | |
| 2004/0040584 A1 | 3/2004 | Miya et al. | |
| 2006/0021636 A1 * | 2/2006 | Miya | 134/33 |
| 2006/0183240 A1 | 8/2006 | Taniyama | |
| 2006/0219264 A1 * | 10/2006 | Miya | 134/21 |
| 2007/0223342 A1 | 9/2007 | Orii et al. | |

FOREIGN PATENT DOCUMENTS

| | | |
|---|---|---|
| JP | 62-188322 | 8/1987 |
| JP | 3-209715 | 9/1991 |
| JP | 7-122485 | 5/1995 |
| JP | 9-38595 | 2/1997 |
| JP | 10-41261 | 2/1998 |
| JP | 10-092784 | 4/1998 |

(Continued)

OTHER PUBLICATIONS

Notice of Allowance issued in corresponding Korean Patent Application No. 2007-0081063 mailed Apr. 29, 2009 (Korean language).

(Continued)

Primary Examiner — Michael Barr
Assistant Examiner — Benjamin Osterhout
(74) Attorney, Agent, or Firm — Ostrolenk Faber LLP

(57) ABSTRACT

A rinsing liquid (DIW) is discharged from a rinsing liquid discharge port formed in a blocking member to perform rinsing processing to a substrate surface while a nitrogen gas is supplied into a clearance space, and a liquid mixture (IPA+DIW) is discharged from a liquid mixture discharge port formed in the blocking member to replace the rinsing liquid adhering to the substrate surface with the liquid mixture while the nitrogen gas is supplied into the clearance space. Thus, an increase of the dissolved oxygen concentration of the liquid mixture can be suppressed upon replacing the rinsing liquid adhering to the substrate surface with the liquid mixture, which makes it possible to securely prevent from forming an oxide film or generating watermarks on the substrate surface.

6 Claims, 11 Drawing Sheets

FOREIGN PATENT DOCUMENTS

| | | |
|---|---|---|
| JP | 11-54472 A | 2/1999 |
| JP | 11-162898 | 6/1999 |
| JP | 2003-31545 | 1/2003 |
| JP | 2003-92280 | 3/2003 |
| JP | 2003-168668 | 6/2003 |
| JP | 2004-119717 | 4/2004 |
| JP | 2004-146784 | 5/2004 |
| KR | 10-2004-0008059 A | 1/2004 |
| WO | 2006/041077 | 4/2006 |

OTHER PUBLICATIONS

Office Action issued Oct. 30, 2008 for the corresponding Korean Patent Application No. 2007-81063.

Office Action issued Nov. 24, 2009 in related application U.S. Appl. No. 11/767,902, which includes, at pp. 9-10, a provisional obviousness-type double patenting rejection over certain claims of the present application.

Japanese Office Action dated Nov. 9, 2010 in connection with corresponding Japanese Application No. 2006-265137.

* cited by examiner

F I G. 7 A
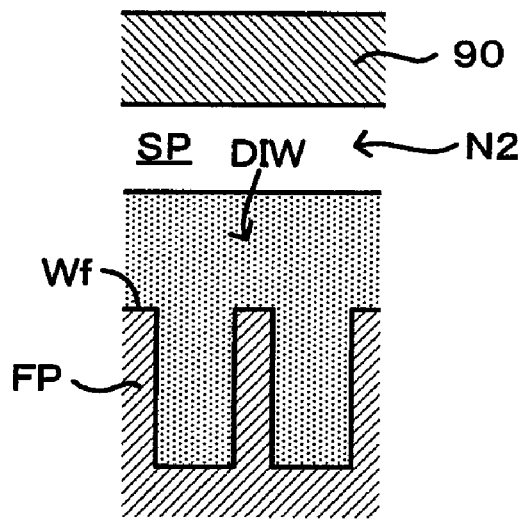
F I G. 7 B
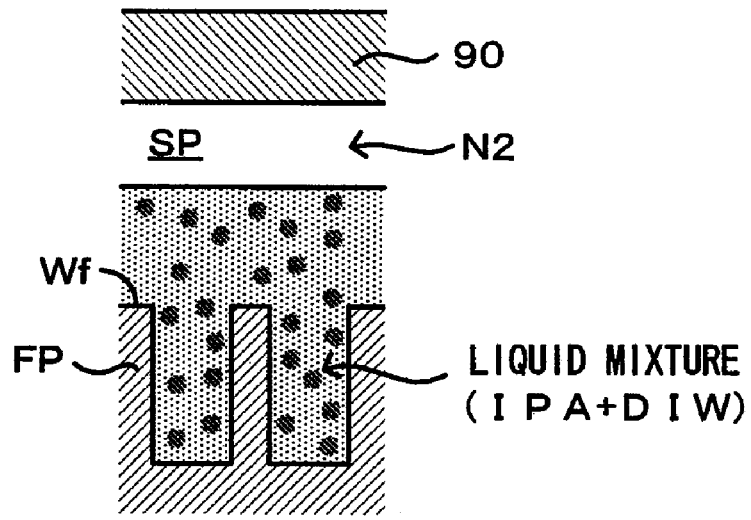

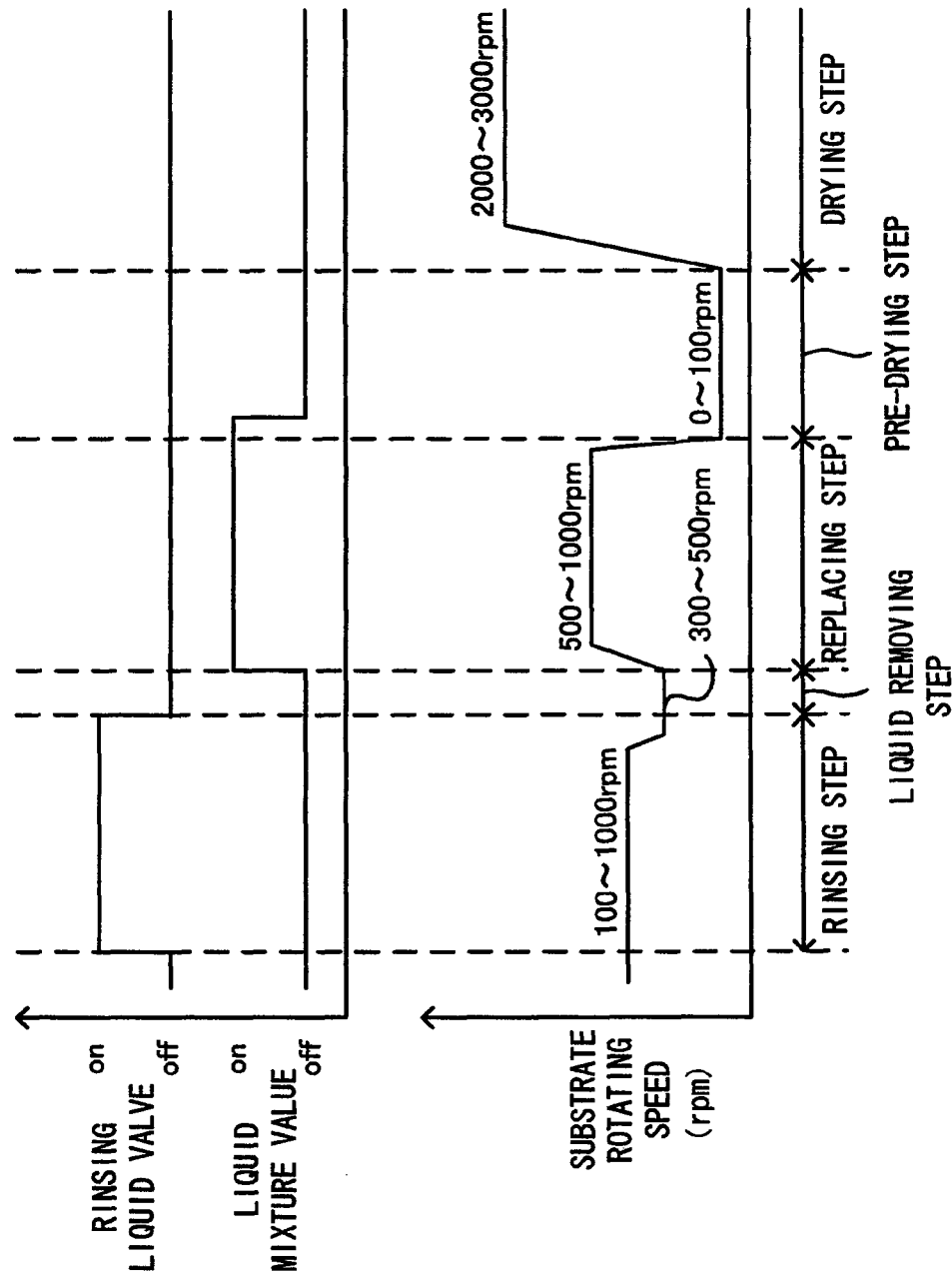

SUBSTRATE PROCESSING APPARATUS AND SUBSTRATE PROCESSING METHOD

CROSS REFERENCE TO RELATED APPLICATION

The disclosure of Japanese Patent Application No. 2006-265137 filed Sep. 28, 2006 including specification, drawings and claims is incorporated herein by reference in its entirety.

BACKGROUND OF THE INVENTION

1. Field of the Invention

The present invention relates to a substrate processing apparatus and a substrate processing method for applying a predetermined wet processing to a substrate surface by supplying a processing liquid to the substrate surface, and then, drying the substrate surface wet with the processing liquid. Substrates to be dried include semiconductor wafers, glass substrates for photomasks, glass substrates for liquid crystal displays, glass substrates for plasma displays, substrates for FEDs (field emission displays), substrates for optical discs, substrates for magnetic discs, and substrates for magnet-optical discs.

2. Description of the Related Art

Numerous drying methods have already been proposed which aim at removal of a rinsing liquid adhering to a substrate surface after chemical processing using a chemical solution and rinsing processing using a rinsing liquid which may be pure water or the like. Known as one such method is a drying method which uses a liquid (low surface tension solvent) including an organic solvent component whose surface tension is lower than pure water such as IPA (isopropyl alcohol). There is a drying method described in JP-A-9-38595 for instance as such a drying method. In a substrate processing apparatus which executes this drying method, after hydrofluoric acid treatment of a substrate surface, pure water is supplied to the substrate surface and cleaning processing (rinsing processing) is accordingly attained. Following this, IPA is supplied to the substrate surface without any break after the end of the supply of pure water or from the middle of the supply of pure water. In consequence, IPA is dissolved in pure water which is present on the substrate surface, and replaces pure water. The substrate is rotated at a high speed thereafter, which removes IPA from the substrate surface and the substrate surface is dried.

Further, according to a resist developing method described in JP-A-3-209715, the substrate surface is dried while the amount of micro foreign matters present on the substrate surface is reduced in the following manner. First, pure water is supplied to the substrate after development of a resist, thereby performing pure water cleaning (rinsing processing). After this, pure water containing IPA at the capacity ratio of about 10% (IPA solution) is supplied to the substrate, whereby the substrate is cleaned. This is followed by spin drying of the substrate while rotating the substrate at a high speed.

SUMMARY OF THE INVENTION

Incidentally, in order to replace the pure water on the substrate surface with IPA or IPA solution after rinsing processing, IPA or IPA solution needs to be fed to the respective parts of the substrate surface. Hence, when replacing processing by means of IPA or IPA solution is performed, a liquid (low surface-tension solvent) having a lower surface tension than the pure water is fed to the respective parts of the pure water adhering to the substrate surface. Then, a convective flow (Marangoni convective flow) is induced based on a surface tension difference between the pure water and the low surface-tension solvent at the respective parts of the substrate surface. This promotes the agitation of the liquid on the substrate surface, thereby increasing a chance of the liquid on the substrate surface being exposed to ambient environment (air). As a result, the dissolved oxygen concentration of the liquid (IPA or IPA solution) adhering to the substrate surface increases as replacing processing proceeds, and the substrate surface is entirely or partly oxidized, which has caused a problem of forming an oxide film or generating watermarks on the substrate surface.

An object of the present invention is to satisfactorily dry a substrate surface while preventing the generation of watermarks on the substrate surface in a substrate processing apparatus and a substrate processing method for drying the substrate surface wet with a processing liquid using a low surface-tension solvent such as IPA.

According to a first aspect of the present invention, there is provided a substrate processing apparatus, comprising: a substrate holder which holds a substrate in a substantially horizontal posture; a substrate rotating unit which rotates the substrate held by the substrate holder about a predetermined rotation axis; a blocking member which includes a processing liquid discharge port and a solvent discharge port which respectively discharge a processing liquid and a low surface-tension solvent having a lower surface tension than the processing liquid to a central part of a surface of the substrate held by the substrate holder, and is arranged away from the substrate surface while facing the substrate surface; a gas supplier which supplies an inert gas into a clearance space defined between the blocking member and the substrate surface, wherein after supplying the processing liquid to the substrate surface to perform predetermined wet processing to the substrate surface, the low surface-tension solvent is supplied to the substrate surface, and then the low surface-tension solvent is removed from the substrate surface to dry the substrate surface, the processing liquid is discharged from the processing liquid discharge port to perform the wet processing while the gas supplier supplies the inert gas into the clearance space, and the low surface-tension solvent is discharged from the solvent discharge port to replace the processing liquid adhering to the substrate surface with the low surface-tension solvent while the gas supplier supplies the inert gas into the clearance space.

According to a second aspect of the present invention, there is provided a substrate processing method, comprising: a blocking-member arranging step of arranging a blocking member away from a substrate surface while facing the substrate surface, the blocking member including a processing liquid discharge port and a solvent discharge port which respectively discharge a processing liquid and a low surface-tension solvent having a lower surface tension than the processing liquid to a central part of the surface of a substrate which is held in a substantially horizontal posture; a wet processing step of discharging the processing liquid from the processing liquid discharge port to the substrate surface while the substrate is rotated to perform predetermined wet processing to the substrate surface; a replacing step of discharging the low surface-tension solvent from the solvent discharge port to the substrate surface wet with the processing liquid while the substrate is rotated to replace the processing liquid adhering to the substrate surface with the low surface-tension solvent; and a drying step of removing the low surface-tension solvent from the substrate surface after the replacing step to dry the substrate surface, wherein an inert gas is supplied, in the wet processing step and the replacing step, into a clearance space defined between the blocking member arranged in the blocking-member arranging step and the substrate surface.

In each of these inventions, the blocking member is arranged away from the substrate surface while facing the substrate surface, and the inert gas is supplied into the clearance space defined between the blocking member and the substrate surface. The processing liquid is discharged from the processing liquid discharge port formed in the blocking member to perform the predetermined wet processing while the inert gas is supplied into the clearance space, and the low surface-tension solvent is discharged from the solvent discharge port to replace the processing liquid adhering to the substrate surface with the low surface-tension solvent while the inert gas is supplied into the clearance space. Accordingly, the wet processing with the processing liquid and the replacing processing with the low surface-tension solvent are performed while the ambient atmosphere of the substrate surface is maintained to be a low oxygen concentration atmosphere. Thus, the dissolution of oxygen into the low surface-tension solvent from the ambient atmosphere of the substrate surface can be reduced upon replacing the processing liquid adhering to the substrate surface with the low surface-tension solvent. As a result, an increase of the dissolved oxygen concentration of the low surface-tension solvent can be suppressed, and hence, it is possible to securely prevent from forming an oxide film or generating watermarks on the substrate surface. Further, since the inert gas atmosphere is set in the clearance space while the blocking member is caused to face the substrate surface, the splash of the processing liquid or the low surface-tension solvent removed from the substrate surface back to the substrate surface can be suppressed. Therefore, the adherence of particles to the substrate surface can be reduced.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIGS. 7A and 7B are diagrams schematically showing the operation of the substrate processing apparatus of FIG. 1.

FIG. 10 is a timing chart showing the operation of a substrate processing apparatus according to a second embodiment of the invention.

DETAILED DESCRIPTION OF THE PREFERRED EMBODIMENTS

First Embodiment

Figure 1:
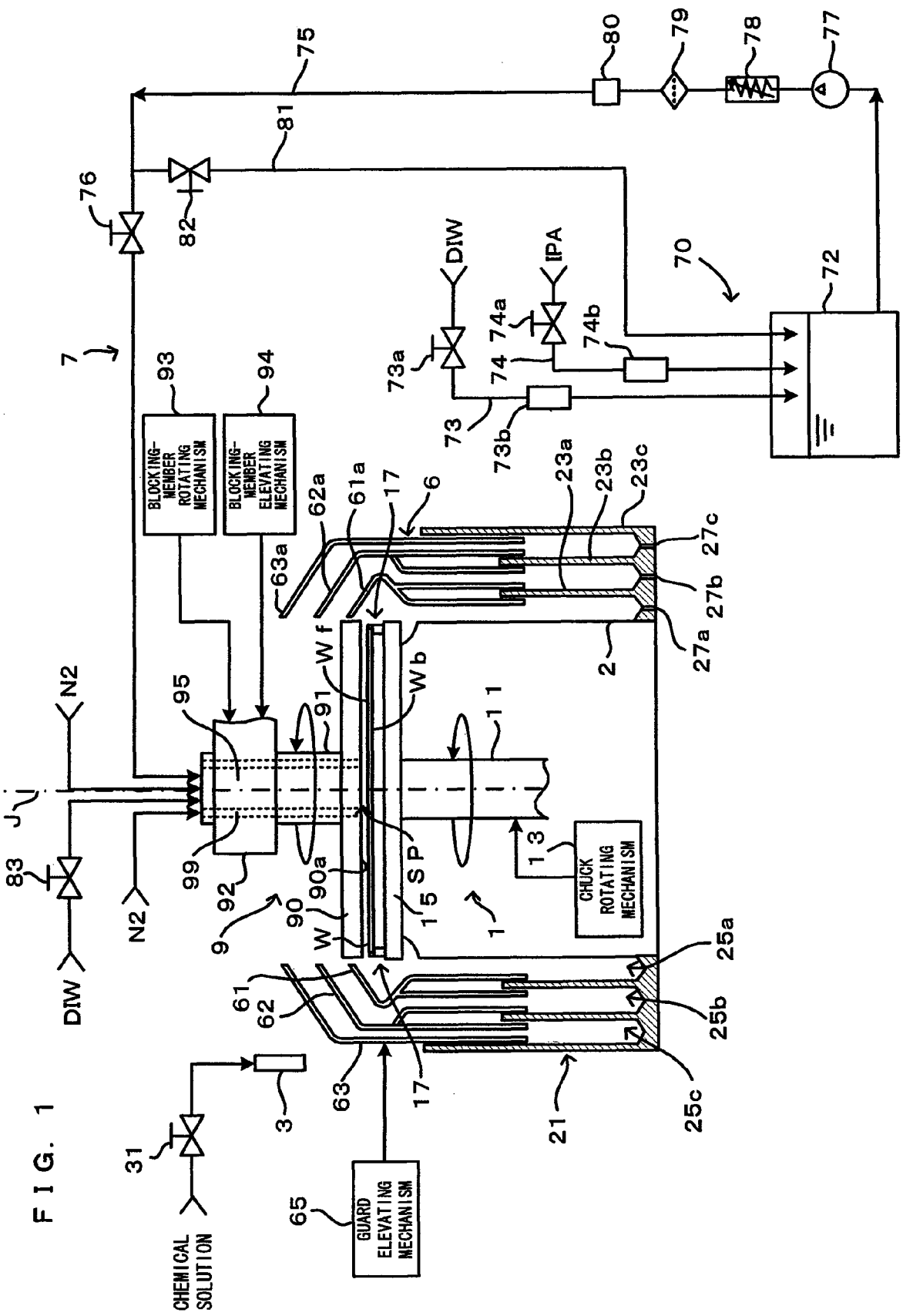
FIG. 1 is a diagram showing a first embodiment of a substrate processing apparatus according to the invention.
Figure 2:
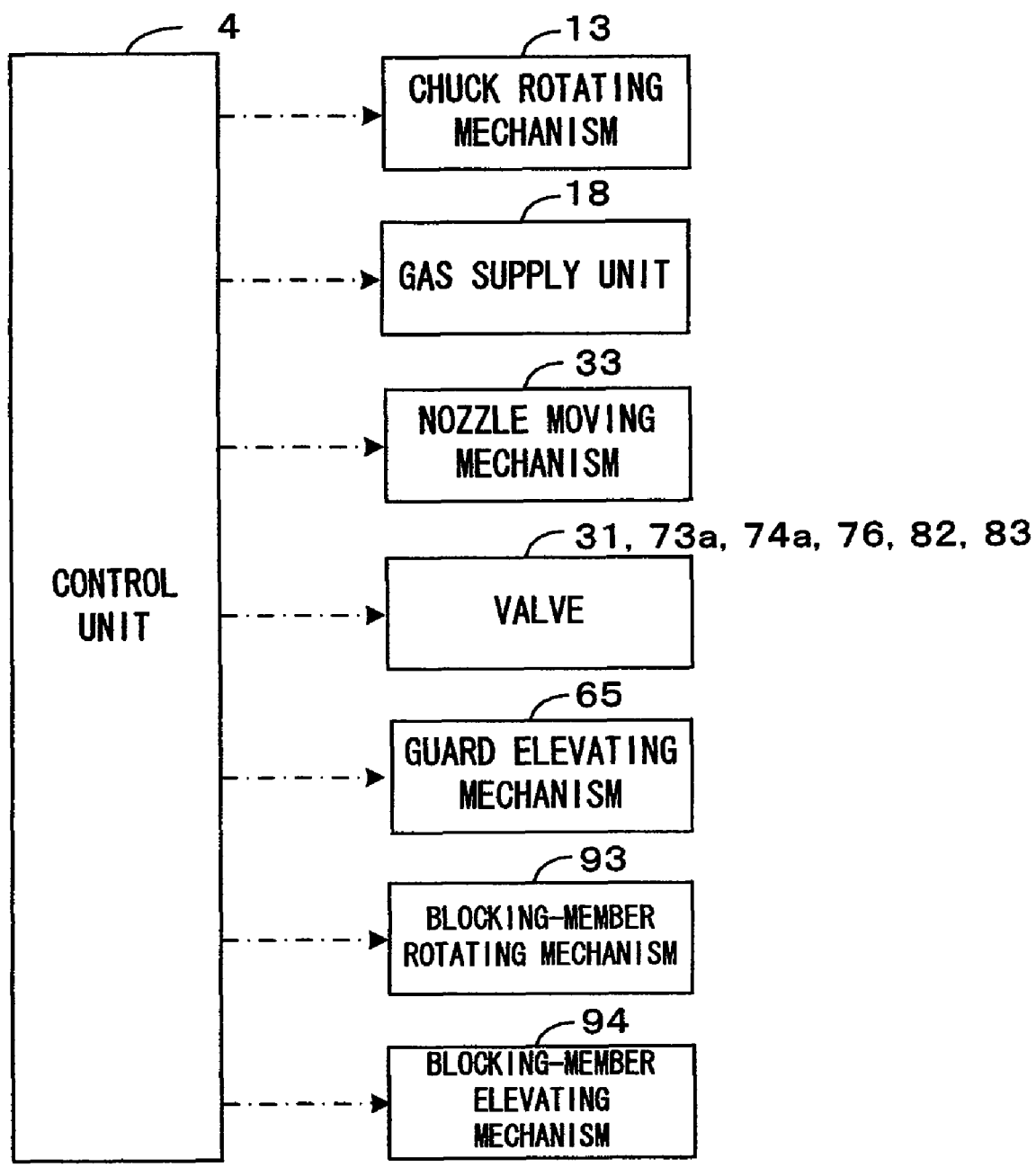
FIG. 2 is a block diagram showing a main control construction of the substrate processing apparatus of FIG. 1.

FIG. 1 is a diagram showing a first embodiment of a substrate processing apparatus according to this invention, and FIG. 2 is a block diagram showing a main control construction of the substrate processing apparatus of FIG. 1. This substrate processing apparatus is a substrate processing apparatus of a single wafer type used for cleaning processing to remove undesired substance adhering to a surface Wf of a substrate W such as a semiconductor wafer. More specifically, after applying chemical processing using a chemical solution such as a hydrofluoric acid and rinsing processing using a rinsing liquid such as pure water or DIW (deionized water) to the substrate surface Wf, this apparatus dries the substrate surface Wf wet with the rinsing liquid. In this embodiment, the substrate surface Wf means a pattern-formed surface on which a device pattern made of poly-Si or the like is formed.

This substrate processing apparatus includes a spin chuck 1, a chemical solution discharging nozzle 3, and a blocking member 9. The spin chuck 1 holds the substrate W in a substantially horizontal posture with the substrate surface Wf faced up and rotates the substrate W. The chemical solution discharging nozzle 3 discharges a chemical solution toward the surface Wf of the substrate W held by the spin chuck 1. The blocking member 9 is disposed at a position above the spin chuck 1.

The spin chuck 1 has a rotary spindle 11 linked to a rotary shaft of a chuck rotating mechanism 13 including a motor, and is rotatable about a rotation axis J (vertical axis) by driving the chuck rotating mechanism 13. These rotary spindle 11 and chuck rotating mechanism 13 are housed in a cylindrical casing 2. A disk-shaped spin base 15 is integrally connected to the upper end of the rotary spindle 11 by means of a fastening part such as a screw. Accordingly, the spin base 15 rotates about the rotation axis J by driving the chuck rotating mechanism 13 in accordance with an operation command from a control unit 4 which controls the entire apparatus. Thus, in this embodiment, the chuck rotating mechanism 13 functions as a "substrate rotating unit" of the invention.

Plural chuck pins 17 for holding the substrate W at the rim thereof are disposed upright in the vicinity of the rim of the spin base 15. It takes not less than three chuck pins 17 to securely hold the disk-shaped substrate W, and the chuck pins 17 are arranged at equal angular intervals along the rim of the spin base 15. Each chuck pin 17 comprises a substrate support part which supports the substrate W at the rim thereof from below and a substrate holding part which presses the substrate W at the outer circumferential edge surface thereof to hold the substrate W. Each chuck pin 17 is structured so as to be capable of switching between a pressing state that the substrate holding part presses the substrate W at the outer circumferential edge surface thereof and a released state that the substrate holding part stays away from the outer circumferential edge surface of the substrate W.

The plural chuck pins 17 are in the released state while the substrate W is being transferred to the spin base 15 but in the pressing state for cleaning of the substrate W. When in the pressing state, the plural chuck pins 17 hold the substrate W at the rim thereof and keep the substrate approximately horizontally at a predetermined distance from the spin base 15. The substrate W is held with its front surface (pattern-formed surface) Wf directed toward above and its back surface Wb toward below. Thus, in this embodiment, the chuck pins 17 function as a "substrate holder" of the invention. The substrate holder is not limited to the chuck pins 17, and a vacuum chuck which supports the substrate W by sucking the substrate back surface Wb may be used.

The chemical solution discharging nozzle 3 is connected with a chemical solution supplying source via a chemical solution valve 31. Hence, when the chemical solution valve 31 opens or closes based on a control command from the control unit 4, the chemical solution is pressure-fed from the chemical solution supplying source toward the chemical solution discharging nozzle 3, and the chemical solution discharging nozzle 3 discharges the chemical solution. Meanwhile, hydrofluoric acid, BHF (buffered hydrogen fluoride), or the like is used as the chemical solution. Further, the chemical solution discharging nozzle 3 is connected with a nozzle moving mechanism 33 (FIG. 2). The nozzle moving mechanism 33 is driven in response to an operation command from the control unit 4, hence, the chemical solution discharging nozzle 3 reciprocally moves between a discharge position which is above the center of rotation of the substrate W and a stand-by position which is off the discharge position to the side.

The blocking member 9 includes a plate-like member 90, a rotary spindle 91 which is hollow inside and supports the plate-like member 90, and an inner inserted shaft 95 which is inserted in a hollow part of the rotary spindle 91. The plate-like member 90 is a disk-shaped member having an aperture in the center, and opposed to the surface Wf of the substrate W held by the spin chuck 1. A lower surface (bottom surface) 90a of the plate-like member 90 serves as a substrate facing surface which faces the substrate surface Wf substantially in parallel, and is formed to have a planar size equal to or larger than the diameter of the substrate W. The plate-like member 90 is substantially horizontally mounted on the bottom end of the rotary spindle 91 having a substantially cylindrical shape, and the rotary spindle 91 is so held by a horizontally extending arm 92 as to be rotatable about the rotation axis J passing the center of the substrate W. A bearing (not shown) is mounted between the outer circumferential surface of the inner inserted shaft 95 and the inner circumferential surface of the rotary spindle 91. A blocking-member rotating mechanism 93 and a blocking-member elevating mechanism 94 are connected with the arm 92.

The blocking-member rotating mechanism 93 rotates the rotary spindle 91 about the rotation axis J in accordance with an operation command from the control unit 4. When the rotary spindle 91 is rotated, the plate-like member 90 integrally rotates with the rotary spindle 91. The blocking-member rotating mechanism 93 is constructed to rotate the plate-like member 90 (lower surface 90a) in the same direction and substantially at the same speed as the substrate W as the substrate W held by the spin chuck 1 rotates. Thus, in this embodiment, the blocking-member rotating mechanism 93 functions as a "blocking-member rotating unit" of the invention.

The blocking-member elevating mechanism 94 moves the blocking member 90 close and opposed to the spin base 15 and, conversely, moves the blocking member 90 away from the spin base 15 in accordance with an operation command from the control unit 4. Specifically, by activating the blocking-member elevating mechanism 94, the control unit 4 causes the blocking member 9 to move up to a separated position above the spin chuck 1 upon loading and unloading the substrate W into and from the substrate processing apparatus. On the other hand, the control unit 4 causes the blocking member 9 to move down to a predetermined facing position (position shown in FIG. 1) set right in the vicinity of the surface Wf of the substrate W held by the spin chuck 1 upon applying predetermined processing to the substrate W. In this embodiment, the blocking member 9 is lowered from the separated position to the facing position after the start of rinsing processing and kept at the facing position until drying processing is completed.

Figure 3:
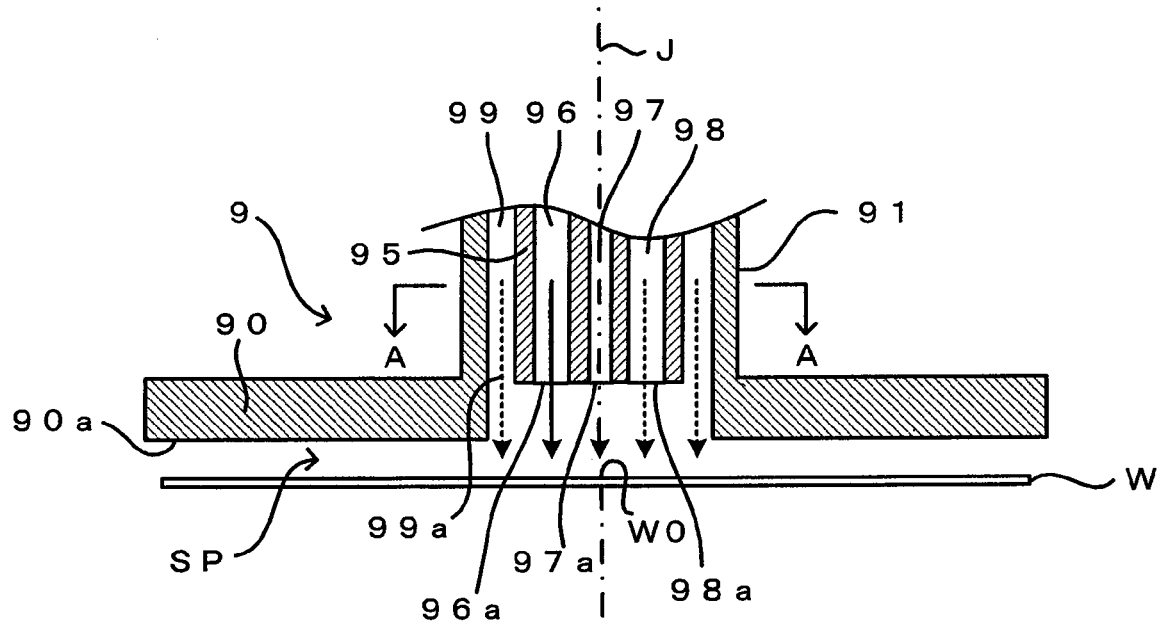
FIG. 3 is a vertical sectional view showing an essential portion of a blocking member equipped in the substrate processing apparatus of FIG. 1.
Figure 4:
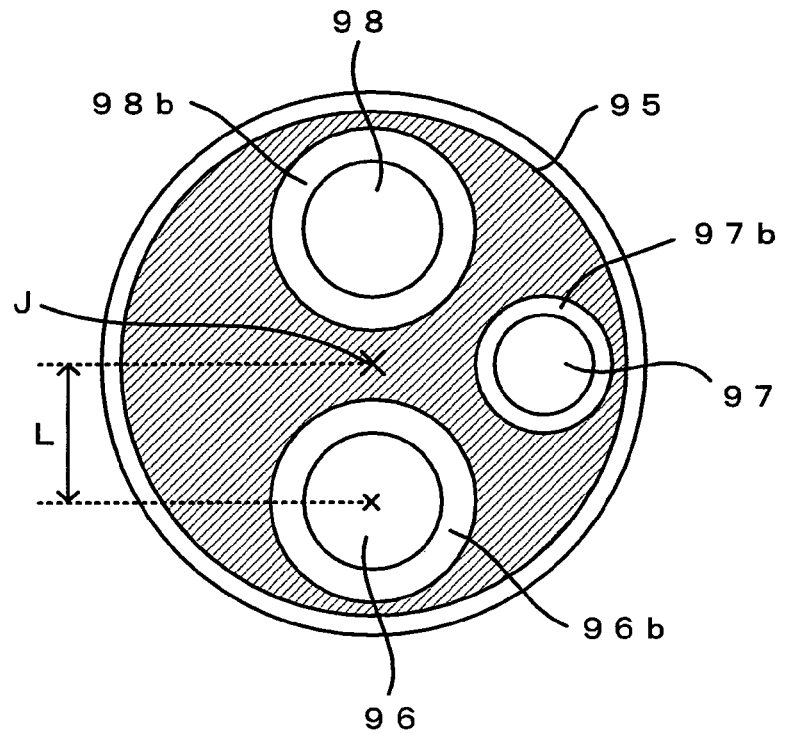
FIG. 4 is a sectional view (horizontal sectional view) taken on line A-A of FIG. 3.

FIG. 3 is a vertical sectional view showing an essential portion of a blocking member equipped in the substrate processing apparatus of FIG. 1, and FIG. 4 is a sectional view (horizontal sectional view) taken on line A-A of FIG. 3. The inner inserted shaft 95 inserted in the hollow part of the rotary spindle 91 has a circular horizontal section. This is for equally holding a clearance between the inner inserted shaft (non-rotary member) 95 and the rotary spindle (rotary member) 91 over the entire circumference, and the clearance between the inner inserted shaft 95 and the rotary spindle 91 is sealed from the outside by introducing a sealing gas thereinto. The inner insertion shaft 95 is formed with three fluid supply passages extending in vertical direction. More specifically, a rinsing liquid supply passage 96, a liquid mixture supply passage 97, and a gas supply passage 98 are formed in the inner inserted shaft 95. The rinsing liquid supply passage 96 is a passage for the rinsing liquid. The liquid mixture supply passage 97 is a passage for a liquid mixture (corresponding to a "low surface-tension solvent" of the invention) in which a liquid having the same composition as the rinsing liquid and an organic solvent component to be dissolved in the liquid to lower the surface tension are mixed. The gas supply passage 98 is a passage for an inert gas such as a nitrogen gas. The rinsing liquid supply passage 96, the liquid mixture supply passage 97 and the gas supply passage 98 are formed by respectively inserting tubes 96b, 97b and 98b made of PFA (perfluoroalkylvinylether copolymer) into the inner inserted shaft 95 made of PTFE (polytetrafluoroethylene).

The bottom ends of the rinsing liquid supply passage 96, the liquid mixture supply passage 97 and the gas supply passage 98 respectively serve as a rinsing liquid discharge port 96a (corresponding to a "processing liquid discharge port" of the invention), a liquid mixture discharge port 97a (corresponding to a "solvent discharge port" of the invention), and a gas discharge port 98a, and face the surface Wf of the substrate W held by the spin chuck 1. In this embodiment, the diameter of the inner inserted shaft is 18 to 20 mm. The bore diameters of the rinsing liquid discharge port 96a, the liquid mixture discharge port 97a and the gas discharge port 98a are 4 mm, 2 to 3 mm and 4 mm, respectively. In this way, the bore diameter of the liquid mixture discharge port 97a is smaller than that of the rinsing liquid discharge port 96a in this embodiment. This can prevent the following problems. Specifically, the liquid mixture (IPA+DIW) has a lower surface tension than the rinsing liquid (DIW). Thus, if the liquid mixture is discharged through a liquid mixture discharge port having the same bore diameter as the rinsing liquid discharge port, there is a likelihood that the liquid mixture drops from the liquid mixture discharge port after the discharge of the liquid mixture is stopped. On the other hand, if the rinsing liquid is discharged through a rinsing liquid discharge port having the same bore diameter as a liquid mixture discharge port, the discharge speed of the rinsing liquid is too fast. As a result, the rinsing liquid (DIW) that is an electrical insulator collides with the substrate surface Wf at a relatively high speed, thereby making it possible that supplied parts of the substrate surface Wf to which the rinsing liquid is directly supplied are charged and oxidized. Contrary to this, in this embodiment, separate discharge ports are provided for the liquid mixture and the rinsing liquid, and the bore diameter of the liquid mixture discharge port 97a is smaller than that of the rinsing liquid discharge port 96a. Thus, the liquid mixture is prevented from dropping from the liquid mixture discharge port and an increase in the discharge speed of the rinsing liquid from the rinsing liquid discharge port is suppressed, whereby the oxidation of the substrate surface Wf caused by charging can be suppressed.

Further, in this embodiment, the rinsing liquid discharge port 96a is provided at a position displaced from the central axis of the blocking member 9, that is, at a position displaced radially outward from the rotation axis J of the substrate W. This can avoid the rinsing liquid discharged from the rinsing liquid discharge port 96a being supplied in such a manner as to concentrate on one point of the substrate surface Wf (rotation center WO of the substrate W). As a result, charged parts of the substrate surface Wf can be scattered and the oxidation of the substrate W caused by charging can be reduced. On the other hand, if the rinsing liquid discharge port 96a is excessively distanced from the rotation axis J, it becomes difficult for the rinsing liquid to reach the rotation center WO of the substrate surface Wf. Accordingly, in this embodiment, distance L from the rotation axis J to the rinsing liquid discharge port 96a (discharge port center) in horizontal direction is set at about 4 mm. Here, an upper limit of the distance L at which the rinsing liquid (DIW) can be supplied to the rotation center WO of the substrate surface Wf is 20 mm on the following conditions.

Flow rate of DIW: 2 L/min
Number of revolutions of substrate: 1500 rpm
State of substrate surface: central part of surface is a hydrophobic surface An upper limit of distance from the rotation axis J to the liquid mixture discharge port 97a (discharge port center) is basically the same as the upper limit (20 mm) of the distance L from the rotation axis J to the rinsing liquid discharge port 96a (discharge port center) as long as the number of revolutions of the substrate is set at 1500 rpm.

On the other hand, distance from the rotation axis J to the gas discharge port 98a (discharge port center) can be arbitrarily set without being particularly limited as long as a nitrogen gas can be supplied into a clearance space SP defined between the blocking member 9 (plate-like member 90) positioned at the facing position and the substrate surface Wf. However, the gas discharge port 98a is preferably provided on the rotation axis J or at a position proximate thereto from the standpoint of blowing the nitrogen gas to a solvent layer of the liquid mixture formed on the substrate surface Wf to remove the solvent layer from the substrate W as described later.

Further, a space portion defined between the inner wall surface of the rotary spindle 91 and the outer wall surface of the inner inserted shaft 95 forms an outer gas supply passage 99, the bottom end of which serves as an annular outer gas discharge port 99a. In other words, the blocking member 9 is formed with the outer gas discharge port 99a in addition to the gas discharge port 98a for discharging the nitrogen gas toward the central part of the substrate surface Wf, the outer gas discharge port 99a being located radially outward of the rinsing liquid discharge port 96a, the liquid mixture discharge port 97a and the gas discharge port 98a and surrounding the rinsing liquid discharge port 96a, the liquid mixture discharge port 97a and the gas discharge port 98a. The aperture area of this outer gas discharge port 99a is formed considerably larger than that of the gas discharge port 98a. Since the blocking member 9 is provided with two kinds of gas discharge ports in this way, the nitrogen gas can be discharged at different flow rates and flow velocities from the respective discharge ports. For example, (1) it is preferable to supply the nitrogen gas at a relatively large flow rate and a low flow velocity so as not to blow the liquid on the substrate surface Wf in order to maintain an inert gas atmosphere as the ambient atmosphere of the substrate surface Wf. On the other hand, (2) it is preferable to supply the nitrogen gas at a relatively small flow rate and a high flow velocity to the central part of the surface of the substrate W upon removing the solvent layer of the liquid mixture formed on the substrate surface Wf from the substrate surface Wf. Accordingly, the nitrogen gas is mainly discharged from the outer gas discharge port 99a in the case (1) and the nitrogen gas is mainly discharged from the gas discharge port 98a in the case (2), whereby the nitrogen gas can be supplied toward the substrate surface Wf at suitable flow rate and flow velocity depending on the usage of the nitrogen gas.

Further, the leading end (bottom end) of the inner inserted shaft 95 is not flush with the lower surface 90a of the plate-like member 90, and is retracted upward from the same plane including the lower surface 90a (FIG. 3). According to such a construction, the nitrogen gas discharged from the gas discharge port 98a can be diffused to decrease the flow velocity thereof to a certain degree by the time the nitrogen gas reaches the substrate surface Wf. Specifically, if the flow velocity of the nitrogen gas from the gas discharge port 98a is too fast, it interferes with the nitrogen gas from the outer gas discharge port 99a, making it difficult to remove the solvent layer of the liquid mixture on the substrate surface Wf from the substrate W. As a result, liquid drops remain on the substrate surface Wf. Contrary to this, according to the above construction, the flow velocity of the nitrogen gas from the gas discharge port 98a can be moderated to reliably remove the solvent layer of the liquid mixture on the substrate surface Wf from the substrate W.

Referring back to FIG. 1, description continues. The upper end of the rinsing liquid supply passage 96 is connected to a DIW supplying source formed by utilities of a plant and the like via a rinsing liquid valve 83, and DIW can be discharged as a rinsing liquid from the rinsing liquid discharge port 96a by opening the rinsing liquid valve 83.

Further, the upper end of the liquid mixture supply passage 97 is connected to a liquid mixture supply unit 7. The liquid mixture supply unit 7 includes a cabinet part 70 for producing the liquid mixture (organic solvent component+DIW) and can pressure-feed the liquid mixture produced in the cabinet part 70 to the liquid mixture supply passage 97. A substance to be dissolved in DIW (surface tension: 72 mN/m) and reduce the surface tension, e.g. isopropyl alcohol (surface tension: 21 to 23 mN/m) is used as the organic solvent component. The organic solvent component is not limited to isopropyl alcohol (IPA), and various other organic solvent components such as ethyl alcohol and methyl alcohol may be used. Further, the organic solvent component is not limited to a liquid, and vapors of various alcohols may be dissolved in DIW as organic solvent components to produce a liquid mixture.

The cabinet part 70 comprises a reservoir tank 72 which holds the liquid mixture of DIW and IPA. The reservoir tank 72 accepts one end of a DIW introducing pipe 73 which is for supplying DIW into inside the reservoir tank 72, and the other end of the DIW introducing pipe 73 is connected via an on-off valve 73a with the DIW supplying source. Further, a flowmeter 73b is inserted in midstream of the DIW introducing pipe 73 and measures the flow rate of DIW which is led to the reservoir tank 72 from the DIW supplying source. Based on the flow rate which the flowmeter 73b measures, the control unit 4 controls opening and closing of the on-off valve 73a so that the flow rate of DIW flowing in the DIW introducing pipe 73 would be a target flow rate (target value).

In a similar manner, the reservoir tank 72 accepts one end of an IPA introducing pipe 74 which is for supplying the IPA liquid into inside the reservoir tank 72, and the other end of the IPA introducing pipe 74 is connected via an on-off valve 74a with an IPA supplying source. Further, a flowmeter 74b is inserted in midstream of the IPA introducing pipe 74 and measures the flow rate of the IPA liquid which is led to the reservoir tank 72 from the IPA supplying source. Based on the flow rate which the flowmeter 74b measures, the control unit 4 controls opening and closing of the on-off valve 74a so that the flow rate of the IPA liquid flowing in the IPA introducing pipe 74 would be a target flow rate (target value).

In this embodiment, the flow rates of IPA liquid and DIW introduced into the reservoir tank 72 are regulated such that a percentage by volume of IPA in the liquid mixture (hereinafter called "IPA concentration") takes a predetermined value lying within a range equal to or below 50%, e.g. the IPA concentration becomes 10%. By setting the IPA concentration in this way, the destruction of a pattern formed on the substrate surface Wf can be efficiently prevented while the consumed amount of IPA is suppressed as described later. Further, measures to prevent exposure to IPA of the apparatus can be simplified as compared to 100% of IPA.

The other end of a liquid mixture supply pipe 75 having one end thereof connected with the liquid mixture supply passage 97 is inserted into the reservoir tank 72, so that the liquid mixture stored in the reservoir tank 72 can be supplied to the liquid mixture supply passage 97 via a liquid mixture valve 76. A constant rate pump 77 for supplying the liquid mixture stored in the reservoir tank 72 to the liquid mixture supply pipe 75, a temperature regulator 78 for regulating the temperature of the liquid mixture supplied to the liquid mixture supply pipe 75 by the constant rate pump 77, and a filter 79 for removing foreign matters in the liquid mixture are provided in the liquid mixture supply pipe 75. Further, a concentration meter 80 for monitoring the IPA concentration is provided in the liquid mixture supply pipe 75.

Further, one end of a liquid mixture circulation pipe 81 branches out from the liquid mixture supplying pipe 75 between the liquid mixture valve 76 and the concentration meter 80, and the other end of the liquid mixture circulation pipe 81 is connected with the reservoir tank 72. A circulation valve 82 is inserted in the liquid mixture circulation pipe 81. During the operation of the apparatus, the constant rate pump 77 and the temperature adjuster 78 are driven all the time, whereas while the liquid mixture is not supplied to the substrate W, the liquid mixture valve 76 is closed and the circulation valve 82 is opened. In this way, the liquid mixture which is pumped out by the constant rate pump 77 from the reservoir tank 72 returns back to the reservoir tank 72 via the liquid mixture circulation pipe 81. In short, when the liquid mixture is not supplied to the substrate W, the liquid mixture circulates in the circulation path composed of the reservoir tank 72, the liquid mixture supplying pipe 75 and the liquid mixture circulation pipe 81. Meanwhile, at the timing for supplying the liquid mixture to the substrate W, the liquid mixture valve 76 is opened and the circulation valve 82 is closed. This provides the liquid mixture supply passage 97 with the liquid mixture which is pumped out from the reservoir tank 72. In this way, by circulating the liquid mixture while it is not supplied to the substrate W, DIW and IPA get agitated, realizing a state that DIW and IPA are adequately mixed with each other. In addition, it is possible to quickly supply after the liquid mixture valve 76 is opened to the liquid mixture supply passage 97 the liquid mixture whose temperature is regulated to a predetermined temperature and which is free from foreign matters.

The upper ends of the gas supply passage 98 and the outer gas supply passage 99 are respectively connected with a gas supply unit 18 (FIG. 2), so that the nitrogen gas can be individually pressure-fed from the gas supply unit 18 to the gas supply passage 98 and the outer gas supply passage 99 in accordance with an operation command from the control unit 4. This enables the nitrogen gas to be supplied into the clearance space SP defined between the blocking member 9 (plate-like member 90) positioned at the facing position and the substrate surface Wf. Thus, in this embodiment, the gas supply unit 18 functions as a "gas supplier" of the invention.

Fixed around the casing 2 is a receiver member 21. Cylindrical partition members 23a, 23b and 23c are disposed upright in the receiver member 21. The space between the outer wall of the casing 2 and the inner wall of the partition member 23a defines a first liquid drainage bath 25a, the space between the outer wall of the partition member 23a and the inner wall of the partition member 23b defines a second liquid drainage bath 25b, and the space between the outer wall of the partition member 23b and the inner wall of the partition member 23c defines a third liquid drainage bath 25c.

Vents 27a, 27b and 27c are formed in bottom portions of the first liquid drainage bath 25a, the second liquid drainage bath 25b and the third liquid drainage bath 25c, respectively, and the respective vents are connected to different drains from each other. In this embodiment for instance, the first liquid drainage bath 25a is a bath for collecting the chemical solution after use and is communicated with a collection drain which collects the chemical solution for reuse. Meanwhile, the second liquid drainage bath 25b is a bath for draining the rinsing liquid after use and is communicated with a waste drain which is for disposal. Further, the third liquid drainage bath 25c is a bath for draining the liquid mixture after use and is communicated with a waste drain which is for disposal.

A splash guard 6 is disposed above the respective liquid drainage baths 25a through 25c. The splash guard 6 is arranged so as to surround the substrate W which is held horizontally by the spin chuck 1 and to freely ascend and descend in a direction of the rotation axis J of the spin chuck 1. The shape of the splash guard 6 is approximately rotational-symmetric to the rotation axis J of the spin chuck 1. The splash guard 6 comprises three guards 61, 62 and 63 which are arranged from the inward side to the outward side in a radial direction in a concentric layout with respect to the spin chuck 1. The three guards 61, 62 and 63 are progressively lower in the order from the outermost guard 63 to the innermost guard 61, and the top ends of the respective guards 61, 62 and 63 are aligned in the same plane which extends in the vertical direction.

The splash guard 6 is connected with a guard elevating mechanism 65 so that when an elevator driving actuator (which may for instance be an air cylinder) of the guard elevating mechanism 65 operates in response to an operation command from the control unit 4, the splash guard 6 moves up and down relative to the spin chuck 1. In this embodiment, since the splash guard 6 ascends or descends stepwise when the guard elevating mechanism 65 is driven, the processing liquid splashing from the rotating substrate W is drained, split into the first through the third liquid drainage baths 25a through 25c.

An upper section of the guard 61 includes a groove-like first guiding part 61a which is open toward inside and is wedge-shaped (V-shaped) in cross section. With the splash guard 6 set to the highest position (which will hereinafter be referred to as the "first height position") during chemical processing, the chemical solution splashing from the rotating substrate W is caught by the first guiding part 61a and guided into the first liquid drainage bath 25a. Describing this in more specific details, when the splash guard 6 is at the first height position so that the first guiding part 61a surrounds the substrate W which is held by the spin chuck 1, the chemical solution splashing from the rotating substrate W is guided into the first liquid drainage bath 25a via the guard 61.

Meanwhile, an upper section of the guard 62 includes a slanted part 62a which is tilted diagonally upward from the outward side to the inward side in the radial direction. With the splash guard 6 set to a lower position than the first height position (which will hereinafter be referred to as the "second height position") during rinsing processing, the rinsing liquid splashing from the rotating substrate W is caught by the slanted part 62a and guided into the second liquid drainage bath 25b. To be more specific, when the splash guard 6 is at the second height position so that the slanted part 62a surrounds the substrate W which is held by the spin chuck 1, the rinsing liquid splashing from the rotating substrate W drops between the top end of the guard 61 and the top end of the guard 62 and is accordingly guided into the second liquid drainage bath 25b.

In a similar way, an upper section of the guard 63 includes a slanted part 63a which is tilted diagonally upward from the outward side to the inward side in the radial direction. With the splash guard 6 set to a lower position than the second height position (which will hereinafter be referred to as the "third height position") during replacing processing, the liquid mixture splashing from the rotating substrate W is caught by the slanted part 63a and guided into the third liquid drainage bath 25c. In more particular words, when the splash guard 6 is at the third height position so that the slanted part 63a surrounds the substrate W which is held by the spin chuck 1, the liquid mixture splashing from the rotating substrate W drops between the top end of the guard 62 and the top end of the guard 63 and is accordingly guided into the third liquid drainage bath 25c.

Further, the splash guard 6 can be set to a lower position than the third height position (hereinafter be referred to as the "retract position"), thereby making the spin chuck 1 project beyond the top end of the splash guard 6 and allowing a substrate transporter (not shown) loads the substrate W yet to be processed onto the spin chuck 1 and receives the processed substrate W from the spin chuck 1.

Figure 5:
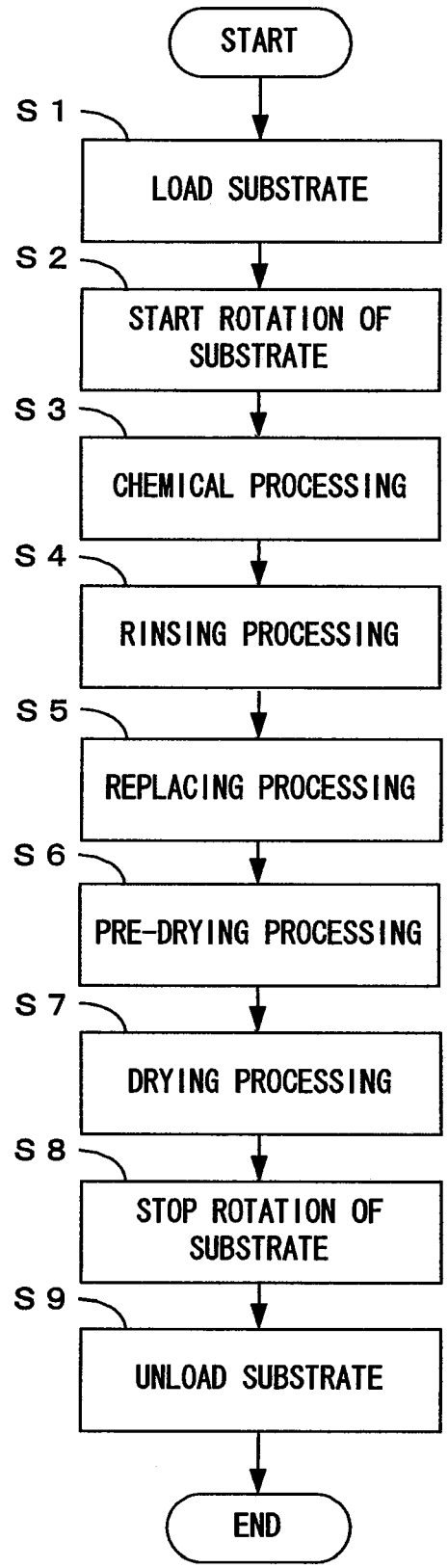
FIG. 5 is a flow chart showing the operation of the substrate processing apparatus of FIG. 1.
Figure 6:
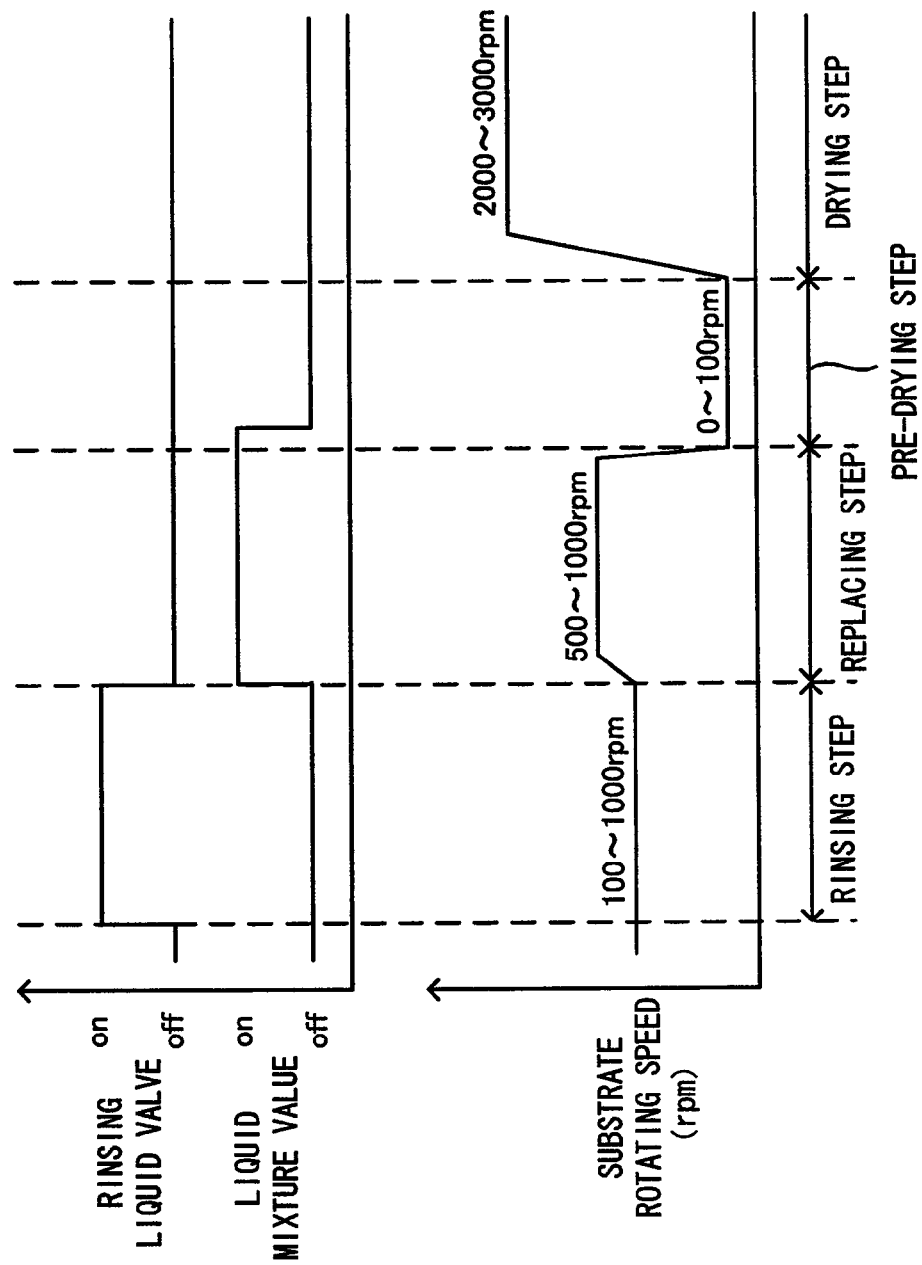
FIG. 6 is a timing chart which shows the operation of the substrate processing apparatus shown in FIG. 1.

Next, the operation of the substrate processing apparatus constructed as above is described in detail with reference to FIGS. 5 to 8. FIG. 5 is a flow chart showing the operation of the substrate processing apparatus of FIG. 1, FIG. 6 is a timing chart showing the operation of the substrate processing apparatus of FIG. 1, and FIGS. 7A, 7B, 8A to 8C are diagrams schematically showing the operation of the substrate processing apparatus of FIG. 1. First, the control unit 4 causes the splash guard 6 to be positioned at the retract position so that the spin chuck 1 projects from the upper end of the splash guard 6. When an unprocessed substrate W is loaded into the apparatus by a substrate transporter (not shown) in this state (Step S1), cleaning processings (chemical processing+rinsing processing+replacing processing+pre-drying processing+drying processing) are performed to the substrate W. A fine pattern made of poly-Si for instance is formed on the substrate surface Wf. Accordingly, in this embodiment, the substrate W is loaded into the apparatus with the substrate surface Wf faced up, and is held by the spin chuck 1. The blocking member 9 is at the separated position above the spin chuck 1 to avoid the interference with the substrate W.

Subsequently, the control unit 4 causes the splash guard 6 to be arranged at the first height position (position shown in FIG. 1) to perform chemical processing to the substrate W. Specifically, the chemical solution discharging nozzle 3 is moved to the discharge position and the substrate W held by the spin chuck 1 is rotated at a predetermined rotating speed (500 rpm for instance) by the driving of the chuck rotating mechanism 13 (Step S2). Then, the chemical solution valve 31 is opened to supply the hydrofluoric acid as the chemical solution from the chemical solution discharging nozzle 3 to the substrate surface Wf. The hydrofluoric acid supplied to the substrate surface Wf is spread by a centrifugal force, whereby the entire substrate surface Wf is chemically processed with the hydrofluoric acid (Step S3). The hydrofluoric acid blown off from the substrate W is guided to the first liquid drainage bath 25a to be suitably reused.

Upon finishing chemical processing, the chemical solution discharging nozzle 3 is moved to the standby position. Then, the splash guard 6 is arranged at the second height position to perform rinsing processing as "wet processing" of the invention to the substrate W. Specifically, the rinsing liquid valve 83 is opened to discharge the rinsing liquid (DIW) from the rinsing liquid discharge port 96a of the blocking member 9 located at the separated position. Simultaneously with the discharge of the rinsing liquid, the blocking member 9 is lowered toward the facing position to be positioned thereat (blocking-member arranging step). By supplying the rinsing liquid to the substrate surface Wf immediately after chemical processing in this way, the substrate surface Wf can be kept wet. This is for the following reason. Specifically, when the hydrofluoric acid is blown off from the substrate W after chemical processing, the drying of the substrate surface Wf starts. As a result, the substrate surface Wf might partly become dry to form stains on the substrate surface Wf in some cases. Accordingly, it is essential to keep the substrate surface Wf wet in order to prevent such partial drying of the substrate surface Wf. Further, the nitrogen gas is discharged from the gas discharge port 98a and the outer gas discharge port 99a of the blocking member 9. Here, the nitrogen gas is mainly discharged from the outer gas discharge port 99a. In other words, a flow rate balance of the nitrogen gas discharged from both discharge ports is adjusted so that the nitrogen gas is discharged at a very small flow rate from the gas discharge port 98a while being discharged at a relatively large flow rate from the outer gas discharge port 99a.

The rinsing liquid supplied to the substrate surface Wf from the rinsing liquid discharge port 96a is spread by a centrifugal force resulting from the rotation of the substrate W, whereby the substrate surface Wf is entirely rinsed (Step S4: wet processing step). In other words, the hydrofluoric acid remaining to adhere to the substrate surface Wf is washed away by the rinsing liquid and removed from the substrate surface Wf. The used rinsing liquid blown off from the substrate W is guided to the second liquid drainage bath 25b for disposal. Further, the ambient atmosphere of the substrate surface Wf is maintained to be low oxygen concentration atmosphere by the supply of the nitrogen gas into the clearance space SP (FIG. 7A). Thus, an increase of the dissolved oxygen concentration of the rinsing liquid can be suppressed. The rotating speed of the substrate W during rinsing processing is set, for example, at 100 to 1000 rpm.

Upon performing rinsing processing described above and replacing processing and drying processing to be described later, the plate-like member 90 of the blocking member 9 is rotated in the same rotating direction and substantially at the same speed as the substrate W. This can prevent an occurrence of a relative rotating speed difference between the lower surface 90a of the plate-like member 90 and the substrate surface Wf, whereby the generation of a swirling air flow can be suppressed. Thus, it can be prevented that the rinsing liquid and the liquid mixture in the form of mist enter the clearance space SP to adhere to the substrate surface Wf. Further, the rinsing liquid and the liquid mixture adhering to the lower surface 90a can be blown off by rotating the plate-like member 90, thereby preventing the rinsing liquid and the liquid mixture from remaining on the lower surface 90a.

Upon finishing rinsing processing of a predetermined time, the rinsing liquid valve 83 is closed to stop the discharge of the rinsing liquid from the rinsing liquid discharge port 96a. Then, the control unit 4 sets the rotating speed of the substrate W at 500 to 1000 rpm and causes the splash guard 6 to be arranged at the third height position. Subsequently, the liquid mixture valve 76 is opened to discharge the liquid mixture (IPA+DIW) from the liquid mixture discharge port 97a. Here, in the cabinet part 70, the liquid mixture whose IPA concentration is adjusted, for example, to 10% is produced beforehand, and this liquid mixture is discharged toward the substrate surface Wf from the liquid mixture discharge port 97a. The liquid mixture supplied to the substrate surface Wf flows by a centrifugal force acting thereon, thereby flowing into inner gaps of a fine pattern FP formed on the substrate surface Wf. In this way, the state changes, for example, from the one shown in FIG. 7A to the one shown in FIG. 7B, and the rinsing liquid (DIW) adhering to the gaps of the fine pattern FP is securely replaced with the liquid mixture (Step S5; replacing step). The used liquid mixture blown off from the substrate W is guided to the third liquid drainage bath 25c for disposal.

An operation when the rinsing liquid on the substrate surface Wf is replaced with the liquid mixture is described in detail below. When replacing processing with the liquid mixture is performed to the rinsing liquid on the substrate surface Wf, liquid (liquid mixture) having a lower surface tension than the rinsing liquid is supplied to parts of the rinsing liquid (DIW) adhering to the substrate surface Wf. Then, as described in the section "SUMMARY OF THE INVENTION", a convective flow (Marangoni convective flow) is induced by a surface tension difference between the rinsing liquid and the liquid mixture at the respective parts on the substrate surface Wf. Thus, the agitation of the liquid on the substrate surface Wf is promoted, thereby increasing a chance of the liquid on the substrate surface Wf being exposed to the ambient atmosphere of the substrate surface Wf. As a result, if the oxygen concentration of the ambient atmosphere is high, dissolved oxygen concentration in the liquid mixture adhering to the substrate surface Wf increases as replacing processing proceeds, whereby the substrate surface Wf might be entirely or partly oxidized to form an oxide film or to generate watermarks on the substrate surface Wf in some cases. Contrary to this, in this embodiment, the rinsing liquid on the substrate surface Wf is replaced with the liquid mixture under the condition that the inert gas atmosphere is maintained in the clearance space SP. Accordingly, the dissolution of oxygen into the liquid mixture can be reduced and an increase of the dissolved oxygen concentration of the liquid mixture can be suppressed.

Figure 8A:
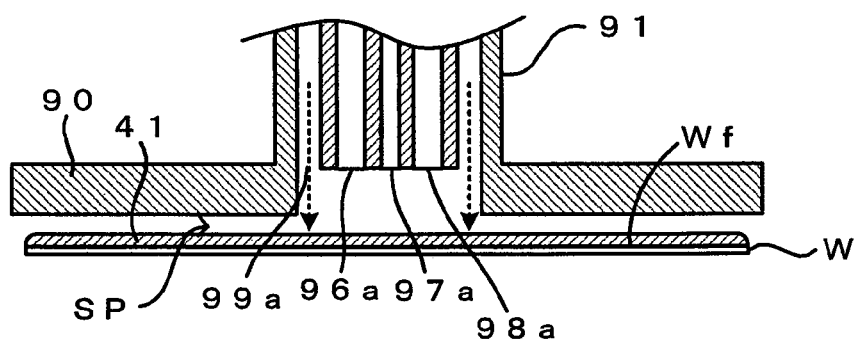
FIGS. 8A to 8C are diagrams schematically showing the operation of the substrate processing apparatus of FIG. 1.
Figure 8B:
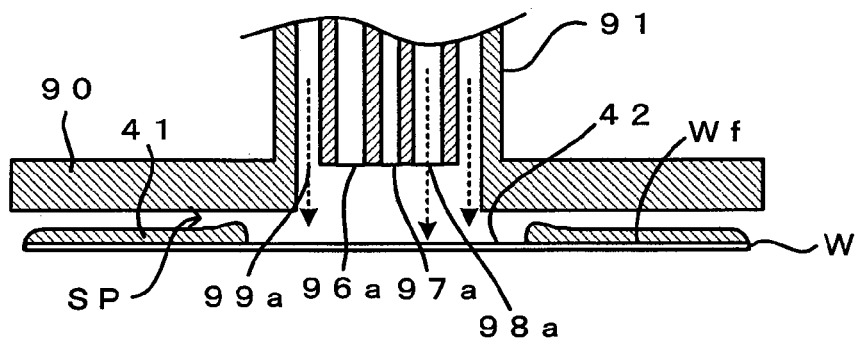
Figure 8C:
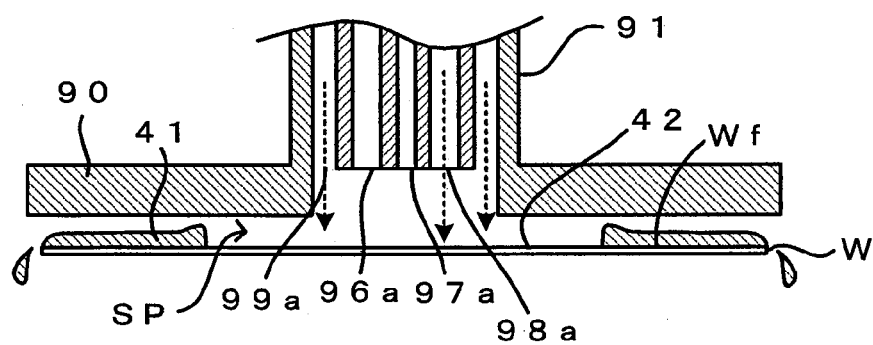

Subsequently, in this embodiment, the liquid mixture on the substrate surface Wf is removed from the substrate W by performing pre-drying processing to be described below (Step S6). First, the control unit 4 stops the rotation of the substrate W or sets the rotating speed of the substrate W at or below 100 rpm with the liquid mixture valve 76 opened. By supplying the liquid mixture to the substrate surface Wf with the substrate W held stationary or rotated at a relative low speed in this way, a puddle-shaped solvent layer 41 of the liquid mixture is formed on the entire substrate surface Wf as shown in FIG. 8A. By forming such a puddle-shaped solvent layer 41 on the substrate surface Wf (puddle processing), the adherence of particles to the substrate surface Wf can be suppressed. Subsequently, the supply of the liquid mixture is stopped and the nitrogen gas is blown toward the central part of the surface of the substrate W from the gas discharge port 98a. Specifically, the flow rate balance of the nitrogen gas discharged from the gas discharge port 98a and the outer gas discharge port 99a is so adjusted as to increase the flow rate of the nitrogen gas discharged from the gas discharge port 98a relative to that of the nitrogen gas discharged from the outer gas discharge port 99a. Then, as shown in FIG. 8B, the liquid mixture in a central part of the solvent layer 41 is pushed away radially outward of the substrate W by the nitrogen gas blown to the substrate surface Wf from the gas discharge port 98a, thereby forming a hole 42 in the central part of the solvent layer 41 and drying a corresponding surface part. By continuing to blow the nitrogen gas to the central part of the surface of the substrate W, the previously formed hole 42 expands in directions toward the rim of the substrate W (transverse directions of FIG. 8C) and the liquid mixture in the central part of the solvent layer 41 is gradually pushed away toward the rim of the substrate to expand a dry area as shown in FIG. 8C. Thus, the liquid mixture adhering to the central part of the surface of the substrate W can be removed without leaving any liquid mixture in the central part of the surface of the substrate W.

By performing pre-drying processing as described above, it can be prevented that drops of liquid mixture remain in the central part of the surface of the substrate W during a period of a drying step (spin drying) and become linear particles to form watermarks on the substrate surface Wf. Specifically, upon removing the liquid mixture adhering to the substrate surface Wf for drying (spin drying) by rotating the substrate W, centrifugal force acting on the liquid mixture is smaller toward the central part of the surface of the substrate W, and accordingly, the surface of the substrate W is dried from the rim. At this time, there were cases where liquid drops remained from the central part of the surface of the substrate W to an area around it, ran in directions toward the rim of the substrate W, and watermarks were formed on move traces of the liquid drops. Contrary to this, in this embodiment, the liquid mixture located in the central part of the surface of the substrate W is eliminated by forming the hole 42 in the central part of the puddle-shaped solvent layer 41 formed on the substrate surface Wf beforehand and expanding the hole 42 before the drying step. Therefore, the formation of watermarks can be securely prevented.

Upon completing pre-drying processing step in this way, the control unit 4 increases the rotating speed of the chuck rotating mechanism 13 to rotate the substrate W at higher speed (e.g. 2000 to 3000 rpm). Thus, the liquid mixture adhering to the substrate surface Wf is blown off to perform drying processing (spin drying) to the substrate W (Step S7; drying step). At this time, pattern destruction and watermark formation can be prevented since the liquid mixture is located in the gaps of the pattern. Further, since the clearance space SP is filled with the nitrogen gas supplied from the gas discharge port 98a and the outer gas discharge port 99a, watermark formation can be more effectively suppressed by shortening a drying period and reducing the elution of oxidizable substances into the liquid component (liquid mixture) adhering to the substrate W. Upon finishing drying processing of the substrate W, the control unit 4 controls the chuck rotating mechanism 13 to stop the rotation of the substrate W (Step S8). Then, the splash guard 6 is located at the retract position and the spin chuck 1 is caused to project upward from the splash guard 6. Thereafter, the substrate transporter unloads the processed substrate W from the apparatus, thereby finishing a series of cleaning processings for one substrate W (Step S9).

As described above, according to this embodiment, rinsing processing is performed while the nitrogen gas is supplied into the clearance space SP defined between the blocking member 9 (plate-like member 90) and the substrate surface Wf, and replacing processing is performed while the nitrogen gas is supplied into the clearance space SP. Thus, upon replacing the rinsing liquid adhering to the substrate surface Wf with the liquid mixture, the dissolution of oxygen into the liquid mixture from the ambient atmosphere of the substrate surface Wf can be reduced. Accordingly, an increase of the dissolved oxygen concentration of the liquid mixture can be suppressed and the formation of an oxide film or generation of watermarks on the substrate surface Wf can be securely prevented. Further, since the inert gas atmosphere is set in the clearance space SP while the blocking member 9 (plate-like member 90) is opposed to the substrate surface Wf, the splash of the rinsing liquid or the liquid mixture removed from the substrate surface Wf back to the substrate surface Wf can be suppressed. Therefore, the adherence of particles to the substrate surface Wf can be reduced.

Further, according to this embodiment, since drying processing is performed while the nitrogen gas is supplied into the clearance space SP, the drying speed of the substrate W is improved, and watermark formation can be effectively prevented by reducing the oxygen concentration of the ambient atmosphere of the substrate surface Wf during drying of the substrate. Further, since a series of processings from rinsing processing to drying processing are performed with the blocking member 9 opposed to the substrate surface Wf and the inert gas atmosphere set in the clearance space SP, the ambient atmosphere of the substrate surface Wf can be stably maintained to be the low oxygen concentration atmosphere. Accordingly, watermark formation can be securely prevented while pattern destruction is prevented. Further, since a series of processings from rinsing processing to drying processing are performed without (vertically) moving the blocking member 9, the processing time can be shortened and the throughput of the apparatus can be improved.

Figure 9:
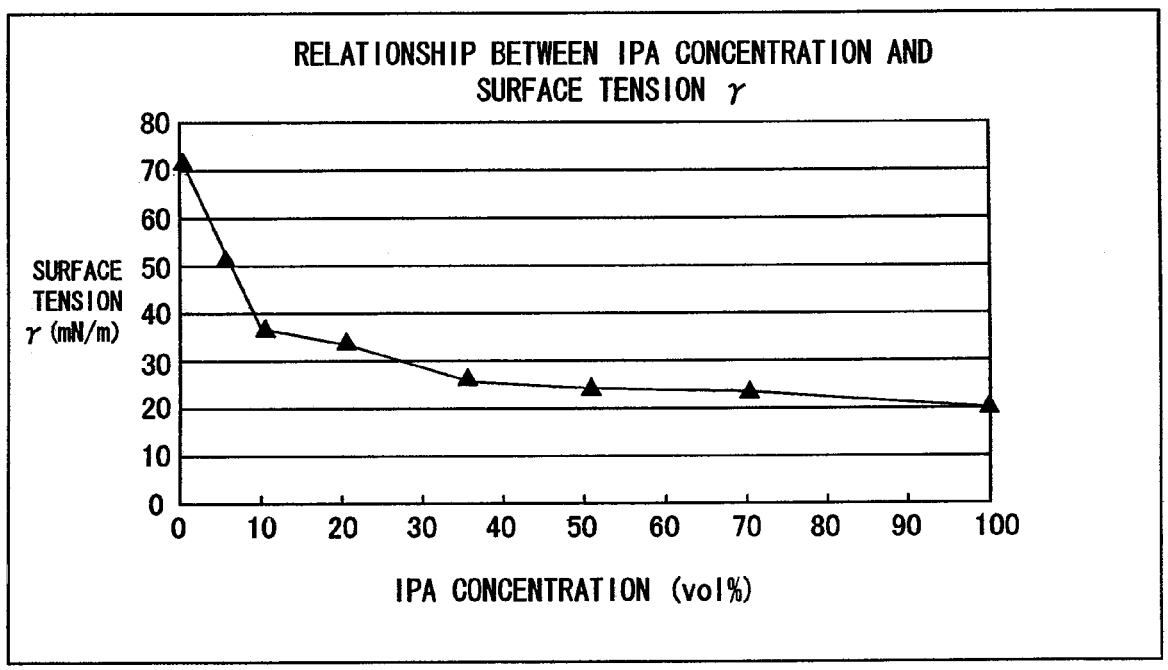
FIG. 9 is a graph showing the relationship between the IPA concentration and surface tension γ.

Further, according to this embodiment, pattern destruction can be efficiently prevented while IPA consumption is suppressed as described below since the IPA concentration is set to or below 50%. FIG. 9 is a graph showing the relationship between the IPA concentration and surface tension y. Horizontal axis of FIG. 9 represents the IPA concentration, wherein the IPA concentration of 0 (vol %) means simple liquid of DIW and IPA concentration of 100 (vol %) means simple liquid of IPA. The surface tension γ is measured using an LCD-400S produced by Kyowa Interface Science Co., Ltd. by a pendant drop method. As is clear from FIG. 9, it can be understood that, as a mixed amount of IPA into DIW is increased, the surface tension y of the liquid mixture sharply decreases with the increase of the mixed amount of IPA into DIW until the IPA concentration is around 10%. It can be understood that, at the IPA concentration of 50% or higher, no large decrease is seen in the surface tension of the liquid mixture and the surface tension is substantially equal to that of the simple liquid of IPA.

Here, in order to effectively prevent pattern destruction, it is important to replace the rinsing liquid (DIW) adhering to the gaps of the patterns with a substance (low surface-tension solvent) having a lower surface tension than the rinsing liquid. In this case, replacing processing described above may be performed using 100% of IPA, but a relatively large amount of IPA is necessary if 100% of IPA is supplied to the substrate surface Wf. Accordingly, it can be thought to supply a relatively small amount of IPA and mix this IPA into DIW from the standpoint of suppressing the consumption amount of IPA in the case of using 100% of IPA. However, if only the relatively small amount of IPA is supplied to the substrate W, even if IPA can be mixed into a surface layer portion of DIW adhering to the substrate surface Wf, it is difficult to introduce IPA into the insides of the pattern gaps.

Contrary to this, by supplying the liquid mixture whose IPA concentration is 50% or lower to the substrate W, DIW adhering to the pattern gaps can be replaced with the liquid mixture while the IPA consumption amount is suppressed. The amount of IPA present in the pattern gaps is smaller in this case than in the case of replacing processing using 100% of IPA. However, from an evaluation result shown in FIG. 9, even if the IPA concentration is increased above 50%, no considerable drop is seen in the surface tension of the liquid mixture and a large decrease cannot be expected for forces inducing pattern destruction (negative forces produced in the pattern gaps). In other words, only the IPA consumption amount increases, but a considerable improvement cannot be expected for the effect of preventing pattern destruction. Accordingly, by setting the IPA concentration to or below 50%, pattern destruction can be efficiently prevented while the IPA consumption amount is suppressed. Based on this standpoint, the IPA concentration is preferably set equal to or above 5% and equal to or below 10%.

Second Embodiment

Figure 11A:
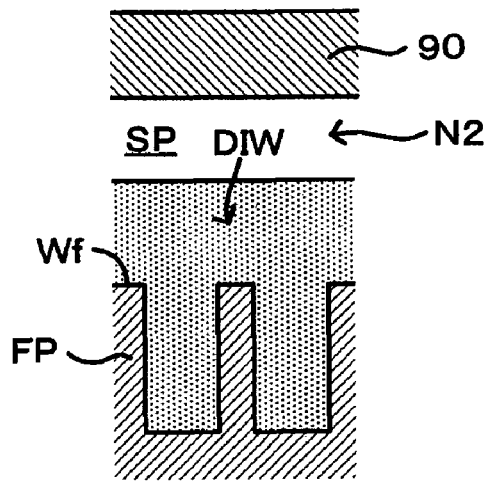
FIGS. 11A to 11C are diagrams schematically showing the operation of the substrate processing apparatus according to the second embodiment of the invention.
Figure 11B:
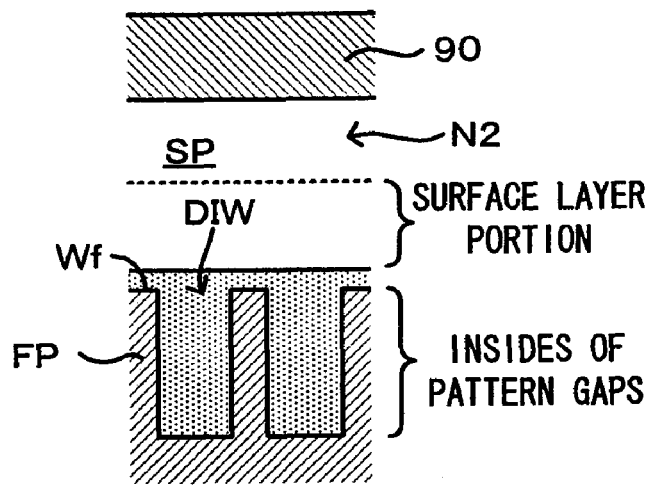
Figure 11C:
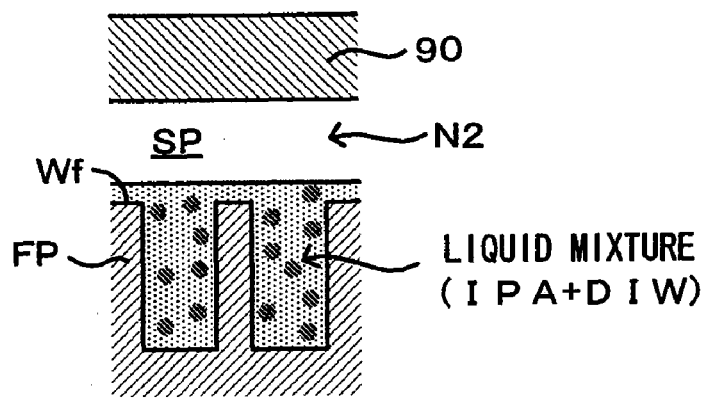

FIG. 10 is a timing chart showing the operation of a substrate processing apparatus according to a second embodiment of the invention, and FIGS. 11A to 11C are diagrams schematically showing the operation of the substrate processing apparatus according to the second embodiment of the invention. The substrate processing apparatus according to the second embodiment largely differs from the first embodiment in that a major part of the rinsing liquid adhering to the substrate surface Wf is blown off to be removed with a part thereof left after the rinsing step and before the replacing step. The other construction and operation are not described here since being similar to those of the first embodiment.

In this embodiment, upon finishing rinsing processing, the control unit 4 sets the rotating speed of the substrate W to 300 to 500 rpm. Although a relatively large amount of the rinsing liquid (DIW) adheres to the substrate surface Wf after rinsing processing (FIG. 11A), a major part of the rinsing liquid on the substrate surface Wf is blown off to be removed from the substrate surface Wf with a part thereof left by rotating the substrate W for a predetermined time set beforehand (liquid removing step). Specifically, it becomes a state (surface layer portion removed state) that only the rinsing liquid at a surface layer portion is removed from the substrate surface Wf with the rinsing liquid in the gaps of the fine pattern FP left (FIG. 11B). As a result, the substrate surface Wf is entirely covered with a liquid film thinner than a liquid film (liquid film composed of the rinsing liquid) adhering to the substrate surface Wf after rinsing processing. According to the rotating speed of the substrate W described above, the surface layer portion removed state can be realized within a relatively short period of time while the drying of the substrate surface Wf is prevented. Accordingly, the period of performing the liquid removing step is, for example, set to 0.5 to 1 sec. Thus, by removing the major part of the rinsing liquid adhering to the substrate surface Wf with the part thereof left prior to replacement (replacing step) with the liquid mixture (IPA+DIW), the liquid mixture can be efficiently introduced to the insides of the pattern gaps in replacing processing (FIG. 11C), even when fine patterns FP are formed on the substrate surface Wf. In other words, by removing the major part of the rinsing liquid, which has stood as a hindrance to the introduction of the liquid mixture into the pattern gaps, from the substrate surface Wf, the liquid mixture can be highly efficiently introduced to the insides of the pattern gaps. Therefore, negative pressures produced in the pattern gaps during the drying of the substrate can be reduced to effectively prevent pattern destruction.

On the other hand, the liquid film of the rinsing liquid on the substrate surface Wf becomes very thin if the rinsing liquid on the substrate surface Wf is roughly removed from the substrate surface Wf as described above. Further, in a case where a pattern exhibiting hydrophobic is present on the substrate surface Wf for example, a part of the substrate surface Wf might be exposed in some cases. At this time, in the case where oxygen concentration of the ambient atmosphere of the substrate surface Wf is high, the oxygen concentration in the rinsing liquid sharply increases by the dissolution of oxygen from the ambient atmosphere into the rinsing liquid, thereby making the substrate surface Wf more likely to oxidize. Further, in the case where a part of the substrate surface Wf is exposed, the substrate surface Wf might be oxidized in some cases by being directly exposed to the ambient atmosphere. Contrary to this, according to this embodiment, the major part of the rinsing liquid on the substrate surface Wf is removed with the nitrogen gas atmosphere set in the clearance space SP. Thus, a sharp increase of the dissolved oxygen concentration in the rinsing liquid on the substrate surface Wf can be suppressed. Accordingly, the oxidation of the substrate surface Wf and watermark formation can be securely prevented. Further, even if a part of the substrate surface Wf is exposed, it can be prevented to directly oxidize the substrate surface Wf since the ambient atmosphere of the substrate surface Wf is controlled to be the inert gas atmosphere.

Further, according to this embodiment, since the major part of the rinsing liquid on the substrate surface Wf is removed, foreign matters such as particles are likely to adhere to the substrate surface Wf. However, the inert gas atmosphere is set in the clearance space SP while the blocking member 9 is opposed to the substrate surface Wf, hence, the adherence of particles to the substrate surface Wf can be reduced.

Third Embodiment

Figure 12:
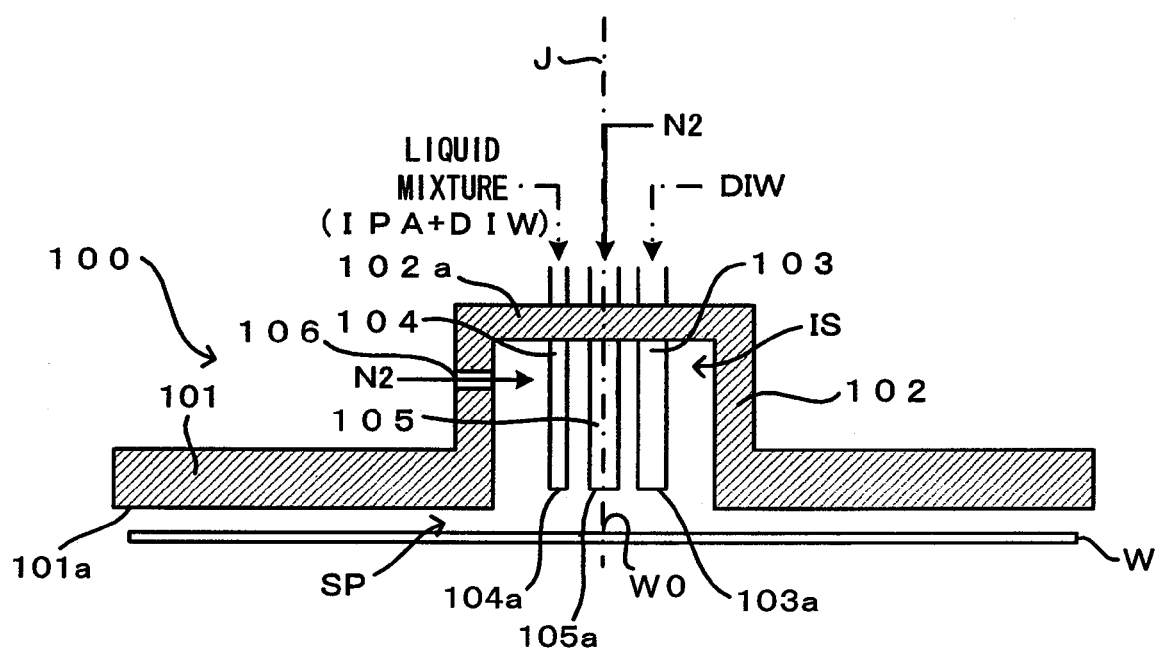
FIG. 12 is a diagram showing a third embodiment of a substrate processing apparatus according to the invention.

FIG. 12 is a diagram showing a third embodiment of the substrate processing apparatus according to the invention. The substrate processing apparatus according to the third embodiment largely differs from the first and second embodiments in that the plate-like member 90 of the blocking member 9 is rotated as the substrate W rotates in the first and second embodiments, whereas the blocking member is arranged away from the substrate surface Wf while being held stationary without being rotated and facing the substrate surface Wf in the third embodiment. The other construction and operation are not described here since being similar to those of the first and second embodiments.

In this embodiment, a blocking member 100 is structured to move upward and downward between a facing position set in the vicinity of the surface Wf of the substrate W held by a spin chuck and a separated position sufficiently distanced upward from the substrate surface Wf, and is moved upward and downward by driving a blocking-member elevating mechanism (not shown).

The blocking member 100 includes a disk-shaped plate-like member 101 having an aperture in its central part and a spindle 102 mounted on the upper surface of the plate-like member 101 and supporting the plate-like member 101. A lower surface (bottom surface) 101a of the plate-like member 101 serves as a substrate facing surface facing the substrate surface Wf substantially in parallel, and is formed to have a planar size equal to or larger than the diameter of the substrate W. The spindle 102 is a bottomed tubular body having an open lower side, and a cylindrical inner space IS having a closed upper side is formed by the inner area of the spindle 102 and the aperture of the plate-like member 101. Three nozzles, that is, a rinsing liquid nozzle 103 for discharging a rinsing liquid (DIW), a liquid mixture nozzle 104 for discharging a liquid mixture (IPA+DIW) and a gas nozzle 105 for discharging an inert gas such as a nitrogen gas, are inserted through an upper surface 102a of the spindle 102 toward the substrate surface Wf. The rinsing liquid nozzle 103, the liquid mixture nozzle 104 and the gas nozzle 105 respectively include a rinsing liquid discharge port 103a (corresponding to a "processing liquid discharge port" of the invention), a liquid mixture discharge port 104a (corresponding to a "solvent discharge port" of the invention) and a gas discharge port 105a which are open toward a central part of the surface of the substrate W.

Upper limits of distances from the rotation axis J to the rinsing liquid discharge port 103a and the liquid mixture discharge port 104a in horizontal direction are as in the first and the second embodiments. The rinsing liquid discharge port 103a and the liquid mixture discharge port 104a are preferably arranged at positions radially distanced from the rotation axis J as long as the rinsing liquid (DIW) can be supplied to a rotation center W0 of the substrate W. Particularly, the rinsing liquid discharge port 103a is preferably arranged at a position distant from the rotation axis J from the standpoint of preventing oxidation caused by the charging of the substrate W. On the other hand, the gas discharge port 105a is preferably arranged on or in the vicinity of the rotation axis J in order to securely remove a solvent layer of the liquid mixture on the substrate surface Wf from the substrate W by means of the nitrogen gas.

Further, the nitrogen gas can be supplied toward the substrate surface Wf from the aperture of the plate-like member 101, that is, a space (inner space IS) surrounding the three nozzles. Specifically, a gas supply passage 106 for supplying the nitrogen gas from a gas supply unit (not shown) into the inner space IS is formed in the spindle 102, that is, in a side wall of the spindle 102 in this embodiment. Thus, the nitrogen gas is supplied into the clearance space SP defined between the blocking member 100 (plate-like member 101) and the substrate surface Wf when the nitrogen gas is pressure-fed from the gas supply unit to the inner space IS.

According to the construction described above, a series of processings from rinsing processing to drying processing are performed with the blocking member 100 (plate-like member 101) opposed to and away from the substrate surface Wf in a stationary state without being rotated. Thus, the construction of the apparatus can be simplified as compared to the case where the plate-like member is rotated. Particularly, according to this embodiment, degrees of freedom in determining the nozzle bore diameters and the arrangement of the three nozzles, that is, the rinsing liquid nozzle 103, the liquid mixture nozzle 104 and the gas nozzle 105 can be improved. Specifically, in the case where the plate-like member 90 is rotated as described in the first and second embodiments, it is necessary to keep the clearance between the rotary spindle (rotary member) 91 and the inner inserted shaft (non-rotary member) 95 sealed from the outside and, accordingly, the diameter of the inner inserted shaft 95 is limited to a predetermined size. In other words, if the diameter of the inner inserted shaft 95 is excessively large, it becomes difficult to seal the clearance between the rotary spindle 91 and the inner inserted shaft 95 from the outside. As a result, there have been specific restrictions on the bore diameters and arrangement of the nozzles (fluid supply passages) formed in the inner inserted shaft 95. Contrary to this, according to this embodiment, the bore diameters and arrangement of the three nozzles can be relatively freely set without the restrictions being imposed as described above. Thus, the gas supply passage 106 can be omitted, for example, by enlarging the bore diameter of the gas nozzle 105 out of the three nozzles. In other words, by means of the nitrogen gas from the gas nozzle 105, (1) the ambient atmosphere of the substrate surface Wf may be maintained to be an inert gas atmosphere and (2) the solvent layer of the liquid mixture on the substrate surface Wf may be removed from the substrate W. In this way, the construction of the apparatus can be further simplified.

<Others>

The invention is not limited to the embodiments described above but may be modified in various manners in addition to the embodiments above, to the extent not deviating from the object of the invention. For instance, although the rinsing liquid discharge port, serving as the "processing liquid discharge port" of the invention, only discharges the rinsing liquid in the above embodiments, it may be constructed that the rinsing liquid and the chemical solution are discharged from the same discharge port. According to this construction, chemical processing and rinsing processing are performed using the chemical solution and the rinsing liquid discharged from a processing liquid discharge port disposed in the blocking member, whereas replacing processing is performed using the liquid mixture discharged from the solvent discharge port. In this modification, the chemical solution and the rinsing liquid corresponds to the "processing liquid" of the invention, and chemical processing and rinsing processing correspond to the "predetermined wet processing" of the invention.

Further, although the blocking member is formed with one processing liquid discharge port, one solvent discharge port and one gas discharge port in the above embodiments, the numbers of these discharge ports are arbitrary. For example, only one liquid mixture discharge port 97a (liquid mixture supply passage 97) is formed in the inner inserted shaft 95 in the first embodiment (FIG. 4), but another liquid mixture discharge port may be formed at a position opposite to the liquid mixture discharge port 97a with respect to the rotation axis J. According to such a construction, the total aperture area of two discharge ports formed in the inner inserted shaft 95 can be increased while the bore diameters of the respective liquid mixture discharge ports are made smaller to prevent the drop of the liquid mixture when the discharge of the liquid mixture is stopped. As a result, the supply amount of the liquid mixture per unit time can be increased. Accordingly, upon forming the solvent layer of the liquid mixture on the substrate surface Wf for instance, the solvent layer can be formed within a relatively short period of time, whereby the throughput of the apparatus can be improved.

Further, although the liquid mixture is produced by mixing the liquid (DIW) having the same composition as the processing liquid and the organic solvent component (IPA) in the cabinet part 70 in the above embodiments, the liquid mixture producing method is not limited to this. For example, the liquid mixture may be produced by mixing the organic solvent component inline into a liquid supply path for supplying DIW toward a liquid supply passage (or nozzle) of the blocking member. A liquid mixture producing unit such as the cabinet part is not limited to installation in the substrate processing apparatus, and may supply a liquid mixture produced in another apparatus different from the substrate processing apparatus to the substrate surface Wf via the blocking member provided in the substrate processing apparatus.

Although the liquid mixture (IPA+DIW) is used as the low surface-tension solvent in the above embodiments, 100% of IPA may be used. Further, instead of the solvent containing the organic solvent component such as IPA, a solvent essentially containing a surfactant may be used.

Further, although the embodiments above use DIW as the rinsing liquid, the rinsing liquid may be a liquid which contains a component which does not exert a chemical cleaning effect upon the substrate surface Wf such as carbonated water (DIW+$CO_2$). In such an instance, a liquid obtained by mixing the organic solvent component with a liquid (carbonated water) whose composition is the same as that of the rinsing liquid adhering to the substrate surface Wf may be used as the liquid mixture. Alternatively, the liquid mixture may be a mixture of the organic solvent component and DIW which is a principal component of carbonated water, while using carbonated water as the rinsing liquid. Further alternatively, the liquid mixture may be a mixture of the organic solvent component and carbonated water, while using DIW as the rinsing liquid. In essence, the liquid mixture may be a mixture of the organic solvent component and a liquid whose principal component is the same as that of the liquid adhering to the substrate surface Wf. Further, the rinsing liquid may be, other than DIW and carbonated water, hydrogen water, diluted ammonia water (having the concentration of around 1 ppm for instance), diluted hydrochloric acid, or the like.

The present invention is applicable to a substrate processing apparatus and a substrate processing method which performs drying processing to a surface of substrates in general including semiconductor wafers, glass substrates for photomasks, glass substrates for liquid crystal displays, glass substrates for plasma displays, substrates for FEDs (field emission displays), substrates for optical discs, substrates for magnetic discs, and substrates for magnet-optical discs.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus, comprising:
   a substrate holder which holds a substrate in a substantially horizontal posture;
   a substrate rotating unit which rotates the substrate held by the substrate holder about a predetermined rotation axis;
   a blocking member which includes a plate-like member arranged away from the substrate surface while facing the substrate surface to define a clearance space with the substrate surface, a rotary spindle which is hollow inside and supports the plate-like member and an inner shaft which is inserted in a hollow part of the rotary spindle;

a processing liquid supplier which discharges a processing liquid from a processing liquid discharge port disposed to an end of the inner shaft to a central part of the substrate surface through the clearance space;

a solvent supplier which discharges a low surface-tension solvent having a lower surface tension than the processing liquid from a solvent discharge port disposed to the end of the inner shaft to the central part of the substrate surface through the clearance space, the solvent discharge port having a bore diameter smaller than that of the processing liquid discharge port; and a gas supplier which includes a first gas discharge port and a second gas discharge port, the first gas discharge port being disposed to the end of the inner shaft near the solvent discharge port and the processing liquid discharge port and discharging an inert gas to the central part of the substrate surface though the clearance space, and the second gas discharge port being an aperture defined between an inner wall surface of the rotary spindle and an outer wall surface of the inner shaft and discharging an inert gas from the blocking member side to the clearance space so that the inert gas from the second gas discharge port surrounds the solvent discharge port, the processing liquid discharge port and the first gas discharge port, wherein an aperture area of the second gas discharge port is larger than an aperture area of the first gas discharge port, and the end of the inner shaft is retracted upward from a plane including a lower surface of the plate-like member and thereby a flow velocity of the gas from the first gas discharge port is decreased.

2. The substrate processing apparatus of claim 1, wherein the substrate rotating unit rotates the substrate to blow the low surface-tension solvent adhering to the substrate surface off from the substrate surface to dry the substrate surface while the gas supplier supplies the inert gas into the clearance space.

3. The substrate processing apparatus of claim 1, wherein, after the replacement with the low surface-tension solvent and before the drying of the substrate surface, the low surface-tension solvent is discharged from the solvent discharge port to form a puddle-shaped solvent layer of the low surface-tension solvent on the entire substrate surface, and the inert gas is discharged to a central part of the surface of the substrate from the gas discharge port to form a hole in a central part of the solvent layer and to expand the hole toward a rim of the substrate.

4. The substrate processing apparatus of claim 1, wherein, after the wet processing with the processing liquid and before the replacement with the low surface-tension solvent, the substrate rotating unit rotates the substrate to blow a major part of the processing liquid adhering to the substrate surface off to be removed from the substrate surface with a part thereof left while the gas supplier supplies the inert gas into the clearance space.

5. The substrate processing apparatus of claim 1, further comprising a blocking-member rotating unit, wherein the blocking member further includes a substrate facing surface which faces the substrate surface, and the blocking-member rotating unit rotates the substrate facing surface about the rotation axis of the substrate.

6. The substrate processing apparatus of claim 1, wherein after supplying the processing liquid to the substrate surface to perform predetermined wet processing to the substrate surface, the low surface-tension solvent is supplied to the substrate surface, and then the low surface-tension solvent is removed from the substrate surface to dry the substrate surface, the processing liquid is discharged from the processing liquid discharge port to perform the wet processing while the gas supplier supplies the inert gas into the clearance space, and the low surface-tension solvent is discharged from the solvent discharge port to replace the processing liquid adhering to the substrate surface with the low surface-tension solvent while the gas supplier supplies the inert gas into the clearance space.

* * * * *